US009691918B2

(12) United States Patent
Mitta et al.

(10) Patent No.: US 9,691,918 B2
(45) Date of Patent: Jun. 27, 2017

(54) SOLAR BATTERY CELL AND MANUFACTURING METHOD FOR THE SOLAR BATTERY CELL

(71) Applicant: SHIN-ETSU CHEMICAL CO., LTD., Tokyo (JP)

(72) Inventors: Ryo Mitta, Kamisu (JP); Takenori Watabe, Annaka (JP); Hiroyuki Otsuka, Kitasaku-gun (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/110,570

(22) PCT Filed: Dec. 1, 2014

(86) PCT No.: PCT/JP2014/081746
§ 371 (c)(1),
(2) Date: Jul. 8, 2016

(87) PCT Pub. No.: WO2015/114937
PCT Pub. Date: Aug. 6, 2015

(65) Prior Publication Data
US 2016/0329442 A1  Nov. 10, 2016

(30) Foreign Application Priority Data

Jan. 31, 2014 (JP) ................. 2014-016450

(51) Int. Cl.
*H01L 21/00* (2006.01)
*H01L 31/0224* (2006.01)
(Continued)

(52) U.S. Cl.
CPC .............. *H01L 31/022441* (2013.01); *H01L 31/02168* (2013.01); *H01L 31/02363* (2013.01);
(Continued)

(58) Field of Classification Search
CPC ....... H01L 31/022441; H01L 31/02168; H01L 31/02363
See application file for complete search history.

(56) References Cited

U.S. PATENT DOCUMENTS

| 2005/0087226 | A1  | 4/2005 | Nishida et al. |
| 2005/0160970 | A1* | 7/2005 | Niira ............... H01L 31/186 117/83 |
| 2010/0233840 | A1* | 9/2010 | Rohatgi .......... H01L 31/022425 438/72 |

FOREIGN PATENT DOCUMENTS

| JP | S58-18976 A | 2/1983 |
| JP | 2005-135942 A | 5/2005 |

(Continued)

OTHER PUBLICATIONS

Feb. 3, 2015 International Search Report issued in International Patent Application No. PCT/JP2014/081746.
(Continued)

*Primary Examiner* — Bradley K Smith
(74) *Attorney, Agent, or Firm* — Oliff PLC

(57) ABSTRACT

Provided is a solar battery cell with low price, high reliability, and high conversion efficiency. A manufacturing method for the solar battery cell including the following processes. That is: forming and laminating a second conductive-type layer and an antireflection film on a first conductive-type semiconductor substrate; applying a conductive paste containing a conductive particle and a glass frit to a predetermined position of the antireflection film; firing the semiconductor substrate with the conductive paste applied thereto; and forming an electrode penetrating the antireflection film and electrically connected to the second conductive-type layer. The semiconductor substrate with the conductive
(Continued)

paste applied thereto is consecutively subjected to heat treatment just after the firing instead of being returned to room temperature.

4 Claims, 2 Drawing Sheets

(51) Int. Cl.
    *H01L 31/068*     (2012.01)
    *H01L 31/0216*     (2014.01)
    *H01L 31/0236*     (2006.01)

(52) U.S. Cl.
    CPC .... *H01L 31/022425* (2013.01); *H01L 31/068* (2013.01); *Y02E 10/547* (2013.01)

(56) References Cited

FOREIGN PATENT DOCUMENTS

| JP | 2005-191315 A | 7/2005 |
|---|---|---|
| JP | 2007-294494 A | 11/2007 |

OTHER PUBLICATIONS

Feb. 3, 2015 Written Opinion issued in International Patent Application No. PCT/JP2014/081746.

Aug. 2, 2016 International Preliminary Report on Patentability issued in International Patent Application No. PCT/JP2014/081746.

* cited by examiner

SOLAR BATTERY CELL AND MANUFACTURING METHOD FOR THE SOLAR BATTERY CELL

TECHNICAL FIELD

The present invention relates to a solar battery cell and a manufacturing method for the solar battery cell.

BACKGROUND ART

In general, a solar battery device includes a configuration shown in FIG. 1. In FIG. 1, the reference numeral 1 represents a p-type semiconductor substrate formed in a plate-like shape, and having a size ranging from 100 to 150 mm square and a thickness ranging from 0.1 to 0.3 mm. The p-type semiconductor substrate herein includes a polycrystalline or monocrystalline silicon and the like and is doped with a p-type impurity such as boron and the like. A manufacturing method for the solar battery device will be hereinafter described. First, this substrate is doped with an n-type impurity such as phosphorus and the like to form an n-type diffusion layer 2. Next, an antireflection film 3 such as silicon nitride (SiN) and the like is provided. Then, a conductive aluminum paste is printed on a backside of the substrate by a screen printing method. Thereafter, by drying and firing the conductive aluminum paste, a backside electrode 6 and a BSF (Back Surface Field) layer 4 are formed simultaneously. Successively, a conductive silver paste is printed on a front-side of the substrate. Then, the conductive silver paste is dried and fired to form front-side electrodes 5. With regard to the solar battery device manufactured in such a manner, the front-side electrodes 5 include busbar electrodes and current-collecting finger electrodes. The busbar electrodes are for taking out light-generating current generated by the solar battery device to the outside thereof. The current-collecting finger electrodes are connected to these busbar electrodes. Hereinafter, while a surface of the substrate which is to be a light receiving surface side of the solar battery is referred to as a front-side, a surface of the substrate which is to be the opposite side of the light receiving surface is referred to as a backside.

With regard to the solar battery device manufactured in such a manner, the electrodes are generally formed by the screen printing method and firing as mentioned above. In the screen printing method, in order to form the finger electrodes and the busbar electrodes on the light receiving surface of the solar battery cell, for example, a conductive paste containing a silver powder, an organic vehicle, and a glass frit is generally used. Solids of various types of inorganic oxides or conductive materials and the like may be added to this conductive paste to improve performance thereof. When applying this conductive paste to a predetermined position of the semiconductor substrate by the screen printing method and firing the paste, the silver powder sinters each other under high-temperature to form silver electrodes. At the same time, the glass frit is softened to melt the antireflection film and reach the n-type diffusion layer, and the silver electrodes are electrically connected to the n-type diffusion layer. In general, such a method is called Fire Through, which is adopted as a method for forming electrodes of various solar battery cells.

With regard to the aforementioned method for forming electrodes, in order to fire the electrodes, the semiconductor substrate should be subjected to high-temperature treatment at 600° C. or more. Due to this high-temperature treatment, the semiconductor substrate is damaged by heat. Alternately, a contaminant which is a lifetime killer gettering upon the diffusion layer may be released inside the semiconductor substrate, which decreases a lifetime of the semiconductor substrate. Furthermore, the electrodes formed by Fire Through are obtained by sintering the conductive particle for a short time. Therefore, the following electrodes may be easily formed, which is a problem. That is, electrodes which have small density compared to electrodes formed by plating and have plenty cavities in front-sides or insides of the electrodes, and each area of those electrodes connected to the semiconductor substrate is not uniform and is easily peeled off, for example. Such a decrease in the lifetime and abnormality in the electrodes may cause problems in performance or long-term reliability of the solar battery cell so that solutions to these problems are demanded.

In order to solve the problems, for example, Patent Document 1 discloses a method where a solar battery cell formed by firing electrodes is subjected to heat treatment under an atmosphere including at least hydrogen gas to improve contact resistance of the electrodes. However, in the method disclosed in Patent Document 1, a process is added after firing, which leads to increase costs. Furthermore, there is a problem in safety of the process since hydrogen gas, which is difficult to handle, is used. Therefore, a much simpler method to solve the problems is demanded.

PRIOR ART REFERENCES

Patent Document

Patent Document 1: JP 2007-294494 A

SUMMARY OF THE INVENTION

Problems to be Solved by the Invention

The present invention has been made to solve the aforementioned problems. An object of the present invention is to provide a solar battery cell with low price, high reliability, and high conversion efficiency.

Means for Solving the Problems

In order to solve the aforementioned problems, a manufacturing method for a solar battery cell according to the present invention includes the following process. That is: forming and laminating a second conductive-type layer and an antireflection film on a first conductive-type semiconductor substrate; applying a conductive paste containing a conductive particle and a glass frit to a predetermined position of the antireflection film; firing the semiconductor substrate with the conductive paste applied thereto; and forming an electrode penetrating the antireflection film and electrically connected to the second conductive-type layer, wherein the semiconductor substrate with the conductive paste applied thereto is consecutively subjected to heat treatment just after the firing instead of being returned to room temperature. Due to such a process, it is possible to decrease contact resistance between the electrode and the silicon substrate and to enhance adhesion intensity therebetween.

Preferably, heating temperature is 300° C. or more and 500° C. or less when the semiconductor substrate with the conductive paste applied thereto is consecutively subjected to the heat treatment just after the firing instead of being returned to room temperature.

Preferably, heating time is one second or more and 60 seconds or less when the semiconductor substrate with the conductive paste applied thereto is consecutively subjected to the heat treatment just after the firing instead of being returned to room temperature.

In the present invention, the antireflection film is preferably configured to be a film obtained by laminating any one of a $SiO_2$ film, an $Al_2O_3$ film, and a SiN film or a combination of those films selected arbitrarily.

In the present invention, processes from the firing to the heat treatment is preferably done consecutively in one apparatus when the semiconductor substrate with the conductive paste applied thereto is consecutively subjected to the heat treatment just after the firing instead of being returned to room temperature. Due to such a configuration, it is possible to improve characteristics of the solar battery cell as well as to minimize an increase of an apparatus area.

Furthermore, the solar battery cell according to the present invention is manufactured by the aforementioned manufacturing method. The solar battery cell manufactured by the manufacturing method is one that has excellent reliability and high conversion efficiency.

DESCRIPTION OF EMBODIMENTS

Embodiments according to the present invention will be hereinafter described in detail. However, the present invention can be carried out in other wide-ranging embodiments in addition to the following descriptions. The scope of the present invention should not be restricted to the followings but is described in CLAIMS. Furthermore, the drawings do not show members in proportion to full-scales. In order to clarify the descriptions and understandings of the present invention, some related members are enlarged in size and some unimportant members are not shown.

Figure 1:
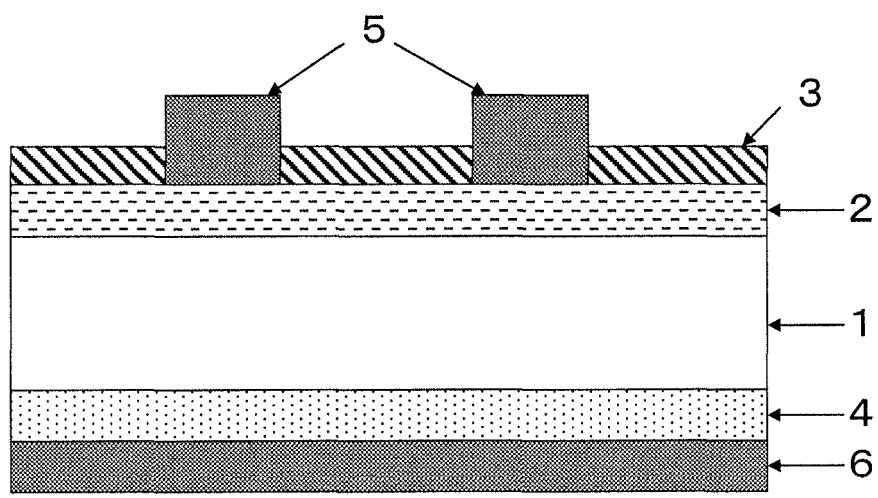
FIG. 1 shows a cross-sectional view of a solar battery device.

As mentioned above, FIG. 1 is a cross-sectional view showing a general configuration of a solar battery device. In FIG. 1, the reference numeral 1 represents a semiconductor substrate, 2 represents a diffusion layer, 3 represents an antireflection film and passivation film, 4 represents a BSF layer, 5 represents front-side electrodes, and 6 represents a backside electrode.

Herein, a manufacturing process for the solar battery device shown in FIG. 1 will be described. First, prepare the semiconductor substrate 1. This semiconductor substrate 1 includes a monocrystalline or polycrystalline silicon and the like. The semiconductor substrate may be of either p-type or n-type, but a p-type silicon substrate is often used. The p-type silicon substrate herein contains a p-type semiconductor impurity such as boron and the like, and resistivity of the substrate is ranging from 0.1 to 4.0 Ω·cm. Hereinafter, a manufacturing method for the solar battery device using the p-type silicon substrate will be described as an example. A preferable p-type silicon substrate is a plate-like substrate having a size ranging from 100 to 150 mm square and a thickness ranging from 0.05 to 0.30 mm. The p-type silicon substrate is immersed in an acid solution such as hydrofluoric acid, hydrofluoric acid-nitric acid, and the like to eliminate damages on a front-side due to slicing and the like. Furthermore, chemical etching is performed on the p-type silicon substrate by using an alkaline solution such as a sodium hydroxide aqueous solution, potassium hydroxide aqueous solution, and the like. Then, the substrate is washed and dried. Accordingly, a concavo-convex formation referred to as a texture is formed on the front-side of the p-type silicon substrate which is to be a light receiving surface of the solar battery device. The concavo-convex formation generates multiple reflection of light upon the light receiving surface of the solar battery device. Therefore, the formation of the concavo-convex formation practically decreases reflectance and improves conversion efficiency.

Thereafter, the p-type silicon substrate is provided under high-temperature gas at temperature from 850° C. to 1000° C. including $POCl_3$, for example. Then, the n-type diffusion layer 2 with sheet resistance ranging from about 30 to 300Ω/☐ is formed on the front-side of the substrate by a thermal diffusion method where an n-type impurity element such as phosphorus and the like is diffused on the whole surface of the p-type silicon substrate. Note that in a case of forming the n-type diffusion layer by the thermal diffusion method, the n-type diffusion layer may be formed on each side and each end of the p-type silicon substrate. In this case, front-sides of necessary n-type diffusion layers are covered with acid-resistant resins, and the p-type silicon substrate having such diffusion layers is immersed in a hydrofluoric acid-nitric acid solution. As a result, it is possible to eliminate unnecessary n-type diffusion layers. Thereafter, by immersing the substrate in pharmaceuticals such as a diluted hydrofluoric acid solution and the like, a glass layer formed on the front-side of the semiconductor substrate during diffusion is eliminated. Then, the substrate is washed with pure water.

Furthermore, the antireflection film and passivation film 3 is formed on the front-side of the p-type silicon substrate. This antireflection film and passivation film 3 includes SiN and the like and is formed by a plasma CVD method and the like where a mixed gas of $SiH_4$ and $NH_3$, for example, is diluted with $N_2$ and the gas is processed to be a plasma by a glow discharge resolution. This antireflection film and passivation film 3 is formed so as to have refraction index of about 1.8 to 2.3 and a thickness of about 500 to 1000 Å, considering a difference between refraction index of the p-type silicon substrate and the like. The antireflection film and passivation film 3 is provided so as to prevent light from being reflected off the front-side of the p-type silicon substrate and to efficiently take in the light inside the p-type silicon substrate. Furthermore, in addition to the performance of antireflection, this SiN also performs as a passivation film having a passivation effect with respect to the n-type diffusion layer when being formed, which improves electric characteristics of the solar battery device.

Next, a conductive paste containing aluminum, a glass frit, varnish and the like is printed on the backside of the p-type silicon substrate by screen printing and is dried. Thereafter, a conductive paste containing silver, a glass frit, varnish and the like is printed on the front-side of the p-type silicon substrate by the screen printing and is dried. Then, the p-type silicon substrate with each conductive paste for electrodes applied thereto is fired at temperature ranging from about 500° C. to 950° C. for one to 60 seconds to form the BSF layer 4, the front-side electrodes 5, and the backside electrode 6, thereby completing a typical crystalline silicon solar battery cell.

In the aforementioned typical manufacturing method for the crystalline silicon solar battery device, electrodes are formed by firing the conductive pastes. Especially in the front-side, due to firing the conductive paste containing the silver, glass frit, varnish, and the like, the glass frit melts and accumulates between the silicon substrate and silver electrodes to play a role as an adhesive which connects the silicon substrate and the silver electrodes. However, due to uneven film thicknesses and widths of the conductive pastes applied to the silicon substrate by the screen printing or due to short firing time and the like, adhesion intensity and contact resistance frequently become unstable between the silicon substrate and the silver electrodes formed after the firing. Consequently, there is a problem that discrepancies appear in the conversion efficiency and long-term reliability of the solar battery cell. Decrease of such discrepancies and development of a stable manufacturing process for the solar battery cell is demanded. These problems are solved by the present invention. More specifically, by consecutively performing the heat treatment in the atmosphere just after firing the electrodes instead of returning to room temperature, it has been found that not only contact areas of the electrodes and the silicon substrate expand, which leads to enhance the adhesion intensity and lower the contact resistance, but also defects in the front-side are terminated and a front-side recombination speed is decreased. What is more, it has been found that gettering of an impurity is accelerated and lifetime of the semiconductor substrate becomes higher. Accordingly, the inventors have discovered that it is possible to obtain electrodes having both high adhesion intensity and low contact resistance, and a solar battery cell having both low interface level density and high lifetime by a simple method, thereby completing the present invention.

Figure 2:
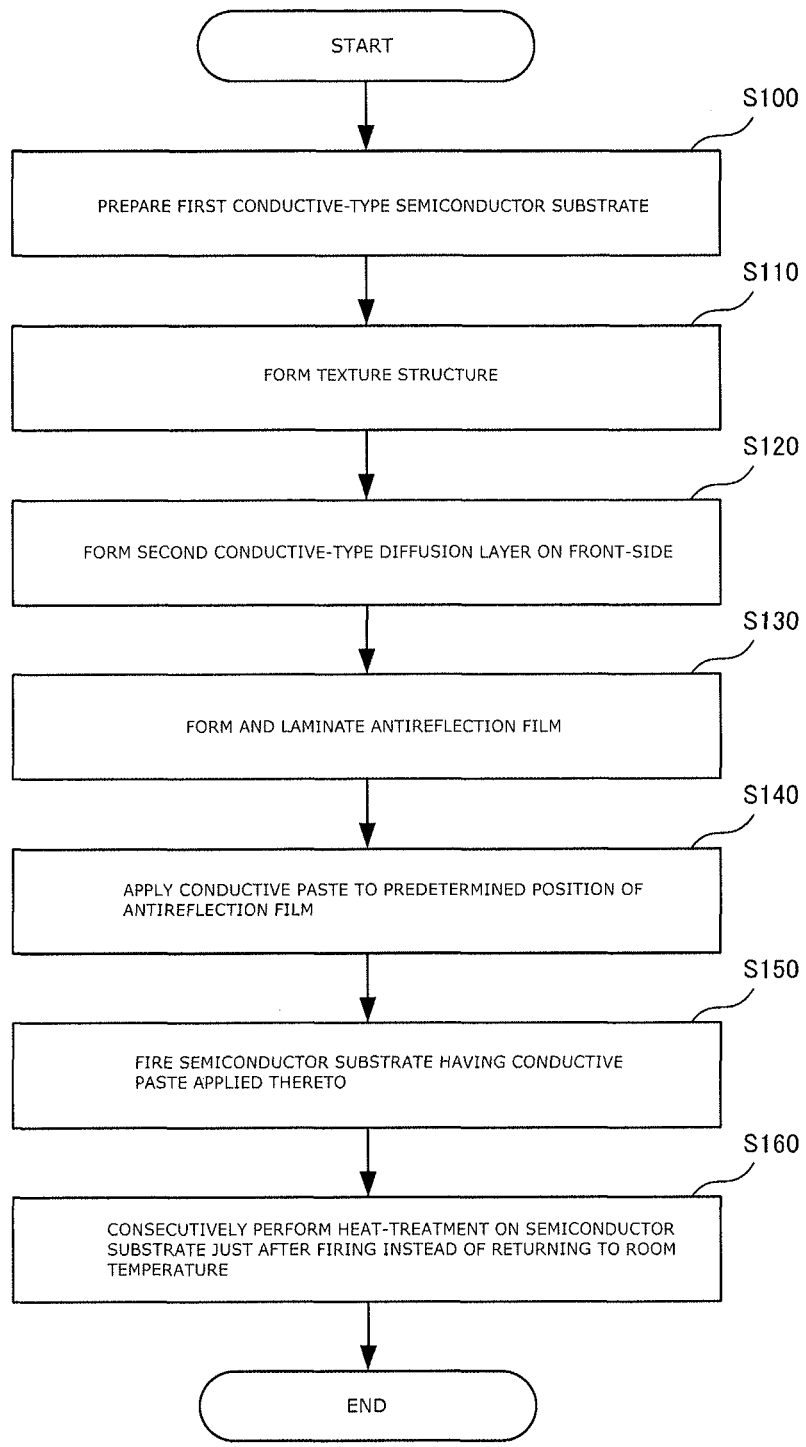
FIG. 2 is a flow chart showing processes of a manufacturing method for a solar battery cell.

In order words, a manufacturing method for a solar battery cell according to an embodiment of the present invention includes the following processes as shown in a flow chart in FIG. 2. First, a first conductive-type semiconductor substrate is prepared (step S100), and a texture is formed on the semiconductor substrate (step S110). Next, a second conductive-type diffusion layer is formed on a front-side of the semiconductor substrate where the texture is formed (step S120), and an antireflection film is formed and laminated on the diffusion layer (step S130). Then, a conductive paste containing a conductive particle and a glass frit is applied to a predetermined position of the antireflection film (step S140). Herein, the conductive paste may be applied to the backside as well, if necessary. Successively, the semiconductor substrate with the conductive paste applied thereto is subjected to firing (step S150). Finally, the semiconductor substrate with the conductive paste applied thereto is consecutively subjected to heat treatment just after the firing instead of being returned to room temperature (step S160).

Improvement in the characteristics of the solar battery cell according to the present invention is caused by the following reasons.

According to the present invention, by performing the heat treatment in the atmosphere after firing the electrodes, the glass frit melts and a glass layer formed between silver electrodes and the silicon substrate spreads thinly and evenly. Therefore, the contact resistance of the electrodes and the silicon substrate becomes lower and the adhesion intensity becomes higher. In general, with regard to firing of a conductive silver paste, a minute particle of silver is formed in the glass layer. This silver minute particle secures conductivity among the silicon substrate, the glass layer, and the silver electrodes and lowers the contact resistance. In the present invention, by performing the heat treatment in the atmosphere after firing the electrodes, growth of the minute particle of silver in this glass layer is accelerated. Therefore, it is possible to achieve much lower contact resistance. By consecutively performing the heat treatment in the atmosphere just after firing the electrodes instead of returning to room temperature according to the present invention, the termination of the defects, by the antireflection film, in the front-side of the silicon substrate is accelerated. Therefore, the defects in the front-side are terminated and the front-side recombination speed is decreased. Furthermore, gettering of a metallic impurity, which is a lifetime killer, is accelerated with respect to the diffusion layer formed on the silicon substrate. Therefore, the lifetime of the silicon substrate becomes higher. Due to such effects, it is possible to obtain electrodes having both high adhesion intensity and low contact resistance, and a solar battery cell having both low interface level density and high lifetime by a simple method.

In the aforementioned manufacturing method for the solar battery cell, when the semiconductor substrate with the conductive paste applied thereto is consecutively subjected to the heat treatment just after the firing instead of being returned to room temperature, heating temperature is preferably 200° C. or more and 600° C. or less. More preferably, the heating temperature is 300° C. or more and 500° C. or less. In a case where the heating temperature is lower than this temperature, the glass frit is hardly softened and the gettering is hardly generated, which requires long period of time for treatment. In a case where the heating temperature is higher than this temperature, the silver electrodes may shrink in excess and may be easily peeled off. Alternatively, the lifetime killer gettering upon the diffusion layer may be released again to decrease the lifetime, which may reduce the effects of the present invention.

Furthermore, in the aforementioned manufacturing method for the solar battery cell, when the semiconductor substrate with the conductive paste applied thereto is consecutively subjected to the heat treatment just after the firing instead of being returned to room temperature, heating time is preferably 0.5 seconds or more and 90 seconds or less. More preferably, the heating time is one second or more and 60 seconds or less. In a case where the heating time is shorter than this time, the glass frit is hardly softened and the gettering is hardly generated. Furthermore, in a case where the heating time is longer than this time, the silver electrodes may shrink in excess and may be easily peeled off, and production capacity is decreased, which may reduce the effects of the present invention.

Furthermore, in the aforementioned manufacturing method for the solar battery cell, the antireflection film formed in the solar battery cell is preferably a film obtained by laminating any one of a $SiO_2$ film, an $Al_2O_3$ film, and a SiN film or a combination of those films selected arbitrarily. Such antireflection films are formed comparatively easily and are effective in terminating the defects in the front-side due to the heat treatment, and the effects of the present invention can be easily obtained.

Furthermore, in the aforementioned manufacturing method for the solar battery cell, the processes from the firing to the heat treatment is preferably done consecutively in one apparatus instead of returning the semiconductor substrate to room temperature when the semiconductor substrate with the conductive paste applied thereto is consecutively subjected to the heat treatment in the atmosphere just after the firing instead of being returned to room temperature. More specifically, in a firing furnace for the electrodes of the solar battery cell to which the silicon substrate is connectively transmitted, a heat treatment zone where the heat treatment of the present invention can be performed is provided to a zone next to a peak heating-and-firing zone. Accordingly, it is possible to obtain maximum effects in improving the characteristics of the solar battery cell as well as to minimize the increase of an apparatus area. Especially, by performing the heat treatment on the substrate after the firing instead of returning to room temperature, it is possible to maximize the effect to decrease the constant resistance of the electrodes due to the heat treatment as well as effects of the gettering and passivation without damaging the substrate by excessive cooling.

The present invention will be hereinafter described in more detail with reference to Examples and Comparative Example, but the present invention should not be restricted thereto and can be applied to wide-ranging usages.

First, a p-type silicon substrate doped with boron and including a p-type monocrystalline silicon was sliced to have a thickness of 0.2 mm. Herein, the p-type silicon substrate had resistivity of approximately 1 Ω·cm. An outside diameter of the p-type silicon substrate was treated so that the substrate would be in a plate-like shape of a 15 cm equilateral rectangle. Next, this p-type silicon substrate was immersed in a hydrofluoric acid-nitric acid solution for 15 seconds, and damage-etching was performed on the substrate. Furthermore, chemical etching with a solution at 70° C. containing 2% of KOH and 2% of IPA was performed on the p-type silicon substrate for five minutes, and the substrate was washed with pure water and dried. Accordingly, a texture structure was formed on a front-side of the p-type silicon substrate.

By performing thermal diffusion treatment with respect to the aforementioned p-type silicon substrate under $POCl_3$ gas atmosphere at temperature of 850° C. for 30 minutes, an n-layer was formed on the p-type silicon substrate. With regard to the front-side of the p-type silicon substrate prepared herein, sheet resistance after the heat treatment was approximately 80Ω/□ in the whole surface, and a diffusion depth of the n-layer was 0.3 μm.

Then, after forming an acid-resistant resin on the n-layer, the p-type silicon substrate was immersed in a hydrofluoric acid-nitric acid solution for ten seconds so that a part of the n-layer where the acid-resistant resin had not been formed was eliminated. Thereafter, by eliminating the acid-resistant resin, the n-layer was formed solely on the front-side of the p-type silicon substrate. Successively, by the plasma CVD method using $SiH_4$, $NH_3$, and $N_2$, SiN which would be the antireflection film and passivation film was formed, with a thickness of 1000 Å, on the front-side of the p-type silicon substrate where the n-layer had been formed.

Next, a conductive aluminum paste was printed, by the screen printing method, on a backside of the p-type silicon substrate on which the aforementioned treatments had been performed, and was dried at 150° C. In addition, a conductive silver paste was printed with a finger pattern on the front-side of the p-type silicon substrate by the screen printing method. Then, the conductive silver paste was dried at 150° C. to form finger electrodes. Thereafter, the conductive silver paste was printed by the screen printing method and was dried at 150° C. so as to form busbar electrodes to be orthogonal to the finger electrodes. The p-type silicon substrate on which the aforementioned treatments had been performed would be hereinafter referred to as a pretreated p-type silicon substrate.

The pretreated p-type silicon substrate having the conductive pastes applied thereto was fired at maximum temperature of 800° C. for five seconds to manufacture a solar battery cell. Such a process was referred to as Comparative Example. Furthermore, the pretreated p-type silicon substrate was consecutively subjected to heat treatment at 150° C. for six seconds just after firing the substrate at maximum temperature 800° C. for five seconds instead of returning to room temperature. Such a process was referred to as Reference Example 1. The pretreated p-type silicon substrate was consecutively subjected to heat treatment at 300° C. for six seconds just after firing the substrate at maximum temperature 800° C. for five seconds instead of returning to room temperature. Such a process was referred to as Example 1. The pretreated p-type silicon substrate was consecutively subjected to heat treatment at 450° C. for six seconds just after firing the substrate at maximum temperature 800° C. for five seconds instead of returning to room temperature. Such a process was referred to as Example 2. The pretreated p-type silicon substrate was consecutively subjected to heat treatment at 600° C. for six seconds just after firing the substrate at maximum temperature 800° C. for five seconds instead of returning to room temperature. Such a process was referred to as Reference Example 2. The pretreated p-type silicon substrate was consecutively subjected to heat treatment at 450° C. for 20 seconds just after firing the substrate at maximum temperature 800° C. for five seconds instead of returning to room temperature. Such a process was referred to as Example 3. The pretreated p-type silicon substrate was consecutively subjected to heat treatment at 400° C. for 80 seconds just after firing the substrate at maximum temperature 800° C. for five seconds instead of returning to room temperature. Such a process was referred to as Reference Example 3.

Table 1 shows results obtained by evaluating adhesion intensity of the electrodes and average conversion efficiency of the solar battery cell when 100 solar battery cells were each manufactured by methods described in the aforementioned Comparative Example, Examples 1 to 3, and Reference Examples 1 to 3. A TAB wire (a wire obtained by solder-plating a flat copper wiring having a width of 2 mm and a thickness of 160 μm) was attached to the busbar electrodes on the front-side of the cell by soldering and was bended 180 degrees in a direction parallel to the busbar electrodes and was drawn. Under such a condition, in a case where the substrate was destroyed before the electrodes were peeled off, the adhesion intensity of the electrodes was evaluated as "high". On the other hand, in a case where the substrate was not destroyed, the adhesion intensity was evaluated as "low".

TABLE 1

| | RESULTS OBTAINED BY EVALUATING ADHESION INTENSITY OF ELECTRODES | AVERAGE CONVERSION EFFICIENCY OF SOLAR BATTERY DEVICE (%) | AVERAGE SHORT CIRCUIT CURRENT OF SOLAR BATTERY DEVICE (A) | AVERAGE OPEN-CIRCUIT VOLTAGE OF SOLAR BATTERY DEVICE (V) | AVERAGE FILL FACTOR OF SOLAR BATTERY DEVICE (%) |
|---|---|---|---|---|---|
| COMPARATIVE EXAMPLE | LOW | 15.5 | 7.81 | 0.62 | 72.1 |
| REFERENCE EXAMPLE 1 | LOW | 15.4 | 7.79 | 0.62 | 71.9 |
| EXAMPLE 1 | HIGH | 15.9 | 7.82 | 0.63 | 72.7 |
| EXAMPLE 2 | HIGH | 15.8 | 7.80 | 0.63 | 72.5 |
| REFERENCE EXAMPLE 2 | LOW | 15.4 | 7.79 | 0.62 | 71.8 |
| EXAMPLE 3 | HIGH | 15.7 | 7.81 | 0.62 | 73.1 |
| REFERENCE EXAMPLE 3 | LOW | 15.1 | 7.78 | 0.62 | 70.4 |

As shown in Table 1, compared to Comparative Example, by utilizing the heating conditions of Examples 1 to 3 according to the present invention, it is possible to enhance not only the average conversion efficiency of the solar battery cell but also the adhesion intensity of the electrodes of the solar battery cell. As the glass frit melts, the glass layer formed between the silver electrodes and the silicon substrate spreads thinly and evenly. This is the reason why it is possible to enhance the adhesion intensity. Due to formation of an excellent glass layer, not only the contact resistance is decreased, which improves fill factor, but also low interface level density can be compatible with high lifetime, which improves short circuit current and open-circuit voltage. These are the reasons why it is possible to enhance the conversion efficiency.

Furthermore, compared to Comparative Example, in the solar battery cell utilizing the heating conditions of Examples 1 to 3 and Reference Examples 1 to 3 according to the present invention, the conversion efficiency is hardly decreased even after long-term storage. It is said that an impurity with high diffusion coefficient such as copper is diffused inside a silicon substrate even in the atmosphere, which may lead to decrease bulk lifetime of a solar battery cell after long-term storage and to decrease conversion efficiency. This phenomenon often appears especially in a solar battery cell using an n-type silicon substrate. It can be considered that gettering of an impurity such as copper is accelerated by utilizing the heating conditions of Examples 1 to 3 and Reference Examples 1 to 3, so that the conversion efficiency of the solar battery cell is hardly decreased even after long-term storage.

According to the embodiments described above, it is possible to provide a solar battery with low price, high reliability, and high conversion efficiency by achieving the followings. That is, electrodes having both high adhesion intensity and low contact resistance by a simple method; decrease in the interface level density at an interface between the diffusion layer and the antireflection film; and high lifetime of the semiconductor substrate.

Note that the present invention should not be restricted to the aforementioned embodiments. The aforementioned embodiments are examples, and any embodiments having configurations and effects substantially similar to technical concepts described in CLAIMS of the present invention are also within the technical scope of the present invention.

REFERENCE SIGNS LIST

1 SEMICONDUCTOR SUBSTRATE
2 DIFFUSION LAYER
3 ANTIREFLECTION FILM AND PASSIVATION FILM
4 BSF LAYER
5 FRONT-SIDE ELECTRODE
6 BACKSIDE ELECTRODE

The invention claimed is:

1. A manufacturing method for a solar battery cell, comprising:
forming and laminating a second conductive-type layer and an antireflection film on a first conductive-type semiconductor substrate;
applying a conductive paste containing a conductive particle and a glass frit to a predetermined position of the antireflection film;
firing the semiconductor substrate with the conductive paste applied thereto; and
forming an electrode penetrating the antireflection film and electrically connected to the second conductive-type layer,
wherein the semiconductor substrate with the conductive paste applied thereto is consecutively subjected to heat treatment just after the firing instead of being returned to room temperature,
wherein a heating temperature of the heat treatment is 300° C. or more and 500° C. or less when the semiconductor substrate with the conductive paste applied thereto is consecutively subjected to the heat treatment just after the firing instead of being returned to room temperature, and
wherein a heating time of the heat treatment is one second or more and 60 seconds or less when the semiconductor substrate with the conductive paste applied thereto is consecutively subjected to the heat treatment just after the firing instead of being returned to room temperature.

2. The manufacturing method for the solar battery cell according to claim 1, wherein the antireflection film is a film obtained by laminating at least one selected from the group consisting of a $SiO_2$ film, an $Al_2O_3$ film, and a SiN film.

3. The manufacturing method for the solar battery cell according to claim 1, wherein processes from the firing to the heat treatment are performed consecutively in one apparatus when the semiconductor substrate with the conductive paste applied thereto is consecutively subjected to the heat treatment just after the firing instead of being returned to room temperature.

4. A solar battery cell manufactured by the manufacturing method according to claim 1.

* * * * *